United States Patent
Jung et al.

(10) Patent No.: US 6,803,172 B2
(45) Date of Patent: Oct. 12, 2004

(54) ORGANIC ANTI-REFLECTIVE COATING MATERIAL AND PREPARATION THEREOF

(75) Inventors: Min-ho Jung, Gyunggi-do (KR); Joong-il Choi, Seoul (KR)

(73) Assignee: Hynix Semiconductor Inc., Kyoungki-Do (KR)

(*) Notice: Subject to any disclaimer, the term of this patent is extended or adjusted under 35 U.S.C. 154(b) by 22 days.

(21) Appl. No.: 10/271,877

(22) Filed: Oct. 16, 2002

(65) Prior Publication Data

US 2003/0087188 A1 May 8, 2003

(30) Foreign Application Priority Data

Oct. 26, 2001 (KR) .......................................... 2001-66346

(51) Int. Cl.$^7$ ................................................. G03C 1/76
(52) U.S. Cl. ................................. 430/270.1; 430/271.1; 430/330; 430/905; 526/219.6; 526/320; 526/346
(58) Field of Search ............................. 430/270.1, 905, 430/330, 271.1; 526/320, 219.6, 346

(56) References Cited

U.S. PATENT DOCUMENTS

| | | | |
|---|---|---|---|
| 4,424,270 A | | 1/1984 | Erdmann et al. |
| 4,822,718 A | | 4/1989 | Latham et al. |
| 5,525,457 A | | 6/1996 | Nemoto et al. |
| 5,674,648 A | | 10/1997 | Brewer et al. |
| 5,728,506 A | * | 3/1998 | Kometani .................... 430/311 |
| 2002/0128410 A1 | * | 9/2002 | Jung et al. ................ 526/219.6 |

* cited by examiner

Primary Examiner—Yvette C. Thornton
(74) Attorney, Agent, or Firm—Marshall, Gerstein & Borun LLP

(57) ABSTRACT

An organic anti-reflective material, in particular one which prevents back reflection from the surface of or lower layers in the semiconductor device and eliminates the standing waves and reflective notching due to the optical properties of lower layers on the wafer, and due to the changes in the thickness of the photosensitive film applied thereon. The organic anti-reflective polymer is useful for forming ultrafine patterns of 64M, 256M, 1G, and 4G DRAM semiconductor devices. A composition containing such an organic anti-reflective polymer, and an anti-reflective coating formed therefrom and a preparation method thereof are also disclosed.

17 Claims, No Drawings

ORGANIC ANTI-REFLECTIVE COATING MATERIAL AND PREPARATION THEREOF

BACKGROUND

1. Technical Field

An organic anti-reflective polymer is disclosed which prevents back reflection of lower film layers and eliminates standing waves that occur by changes in the thickness of photoresist and by light, during a process for forming ultrafine patterns that use photoresist for lithography by using 193 nm ArF. A method of preparing the organic anti-reflective polymer is disclosed as well. More particularly, the disclosed organic anti-reflective polymer is useful for forming ultrafine patterns of 64M, 256M, 1G, and 4G DRAM semiconductor devices. A composition is also disclosed comprising such an organic anti-reflective polymer, an anti-reflective coating therefrom and a preparation method thereof.

2. Description of the Related Art

During a submicrolithographic process, one of the most important processes for fabricating highly integrated semiconductor devices, standing waves inevitably occur and reflective notching of the waves results due to the optical properties of lower layers coated on the wafer and to the changes in the thickness of photosensitive film applied thereon. In addition, the submicrolithographic process generally suffers from a problem of the CD (critical dimension) alteration caused by diffracted and reflected light from the lower layers.

To overcome these problems, it has been proposed to introduce a film, called an anti-reflective coating (hereinafter sometimes referred to as "ARC"), between the substrate and the photosensitive film, which prevents back reflection at the lower layer by introducing organic material having high absorbance at a wavelength range of the light employed as a light source.

Such anti-reflective coating is classified as "inorganic" or "organic" anti-reflective coatings depending upon the material used, or as "absorptive" and "interfering" anti-reflective coatings depending on the operation mechanism.

In conventional microlithography processes using I-line (365 nm wavelength) radiation, inorganic ARCs, for example TiN or amorphous carbon coatings, are employed when advantage is taken of an absorption mechanism, and SiON coatings are employed when an interference mechanism is employed. The SiON ARCs are also adapted for submicrolithographic processes which use KrF light sources.

However, in the above cases involving inorganic anti-reflective films mentioned above, a material to control interference of light at 193 nm is still required and, in recent years, there has been great deal of effort to apply an organic compound as the anti-reflective coating and/or film.

In view of the present development status, organic ARCs must satisfy the following fundamental requirements to be useful.

First, the peeling of the photoresist layer due to dissolution in solvents should not take place when conducting a lithographic process. In this regard, the organic ARCs materials have to be designed so that their cured films have a crosslinked structure without producing by-product.

Second, there should be no migration of chemical materials, such as acids or amines, into and from the ARCs. If acids are migrated from the ARCs, the photosensitive patterns are undercut while the egress of bases, such as amines, causes a footing phenomena.

Third, the etching rate of the ARCs should be faster than that of the upper photosensitive film, allowing an etching process to be conducted smoothly with photosensitive film serving as a mask.

Finally, the organic ARCs should be as thin as possible while playing an excellent role in preventing light reflection.

In recent years, studies have been carried and/or are in progress to develop novel organic anti-reflective films or materials which satisfy the requirements described above, while appropriately controlling the interference. As a result, a number of organic anti-reflective coating materials have been produced.

Such existing organic anti-reflective material is mainly divided into the following two types: (1) polymers containing chromophore, cross-linking agent (single molecule) for cross-linking the polymers and an additive (thermally variable oxidant); and (2) polymers which can cross-link by themselves and which contain chromophore and an additive (thermally variable oxidant). But these two types of anti-reflective material have a problem in that it is impossible to control the k value because the content of the chromophore is defined depending to the ratio originally determined at the time of polymerization, thus, it should be synthesized again if a change of the k value is required.

Accordingly, there is still an urgent need for novel organic anti-reflective material which can control the interference at the ArF wavelength of 193 nm, allowing the k value to be controlled easily only by a variation of reaction concentration.

SUMMARY OF THE DISCLOSURE

A novel organic compound is disclosed which can be used as an anti-reflective coating using 193 nm ArF, 248 nm KrF and 157 nm F2 laser.

A method for preparing an organic compound is disclosed which prevents the diffusion and reflection caused by the light exposure in submicrolithography.

An ARC composition is disclosed which contains such a diffusion/reflection-preventive compound.

An ARC formed from such a composition and a preparation method therefore is also disclosed.

DETAILED DESCRIPTION OF THE PRESENTLY PREFERRED EMBODIMENTS

Polymers are disclosed with specified structures having Formulas 1 and 2.

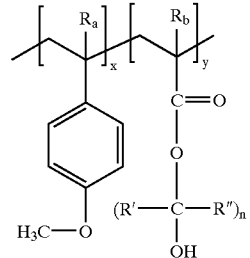

Formula I

In the above Formula 1:

$R_a$ and $R_b$ are independently hydrogen or a methyl group;

R' and R" are independently —H, —OH, —OCOCH$_3$, —COOH, —CH$_2$OH, or substituted or unsubstituted, linear or branched alkyl or alkoxy alkyl having 1 to 5 carbon atoms;

n is an integer selected from 1, 2, 3, 4 and 5; and x and y each is mole fraction in the range of from about 0.01 to about 0.99.

Formula 2

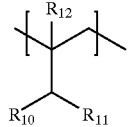

Further, in the above Formula 2:

$R_{10}$ and $R_{11}$ are independently linear or branched substituted $C_{1-10}$ alkoxy alkyl; and $R_{12}$ is hydrogen or methyl.

The polymer of Formula 2 is prepared by polymerizing (meth)acrolein to obtain poly(meth)acrolein followed by reacting the obtained polymeric product with branched or linear substituted alkyl alcohol having 1 to 10 carbon atoms.

More particularly, (meth)acrolein is first dissolved in an organic solvent and added thereto a polymerization initiator to carry out polymerization under a vacuum at a temperature ranging from about 60 to about 70° C. for a time period ranging from about 4 to about 6 hours. Then, the obtained polymeric product is reacted with branched or straight substituted alkyl alcohol having 1 to 10 carbon atoms in the presence of trifluoromethylsulfonic acid as a catalyst at room temperature for a time period ranging from about 20 to about 30 hours.

In the above process, a suitable organic solvent is selected from the group consisting of tetrahydrofuran (THF), cyclohexanone, dimethylformamide, dimethylsulfoxide, dioxane, methylethylketone, benzene, toluene, xylene and mixtures thereof. As a polymerization initiator, it can be mentioned 2,2-azobisisobutyronitrile (AIBN), benzoylperoxide, acetylperoxide, laurylperoxide, t-butylperacetate, t-butylhydroperoxide or di-t-butylperoxide. A preferred example of said alkyl alcohol having 1 to 10 carbon atoms is ethanol or methanol.

A preferred compound of Formula 2 is selected from the group consisting of the compounds of the following Formulas 3 to 6.

Formula 3

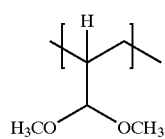

Formula 4

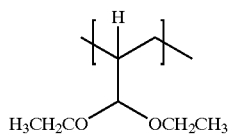

Formula 5

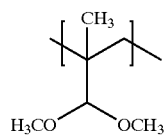

Formula 6

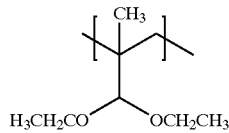

The above compounds of Formulas 3 to 6 are readily cured in the presence of acid and other polymers having an alcohol group, thus, react with the polymer represented by Formula 1 to form a cross-linkage.

Furthermore, the polymer of Formula 1 is prepared by dissolving acetoxystyrene monomer, hydroxyalkylacrylate monomer in an organic solvent and then polymerizing the obtained compound with a polymerization initiator. Any conventional organic solvent can be used in this process but a preferred solvent is selected from the group consisting of tetrahydrofuran, toluene, benzene, methylethylketone, dioxane and mixtures thereof. As a polymerization initiator, any conventional radical polymerization initiator can be used but it is preferrable to use a compound selected from the group consisting of 2,2'-azobisisobutyronitrile, acetylperoxide, laurylperoxide, and t-butylperoxide. The above polymerization reaction is preferably carried out at a temperature ranging from about 50 to about 90° C. and the mole ratio of each monomer is in the range of from about 0.01 to about 0.99.

A disclosed anti-reflective coating composition comprises a polymer of Formula 1 and a polymer of Formula 2.

A preparation method of an organic anti-reflective coating film comprises steps of dissolving a polymer of Formula 1 and a polymer of Formula 2 in an organic solvent, filtering the obtained solution, coating the filtrate on a lower layer and hard-baking the coated layer. Further, any conventional organic solvent can be used in this process but a preferred solvent is selected from the group consisting of ethyl 3-ethoxypropionate, methyl 3-methoxypropionate, cyclohexanone, and propyleneglycolmethylether acetate. It is preferrable that the aforementioned solvent is used in an amount of from about 200 to about 5,000 wt. % based on the total weight of the anti-reflective coating resin used. The preferred temperature range for hard-baking ranges from about 100 to about 300° C.

A semiconductor device can be prepared from any of the aforementioned anti-reflective coating compositions.

Two kinds of monomers (acetoxystyrene monomer, hydroxyalkylacrylate monomer) having large sized chromophores to achieve a high absorbance at 193 nm and capable being cross-linked were first synthesized to produce a primary polymer (being referred to as a polymer having a structure of Formula 1). In addition, a secondary polymer was synthesized (being referred to as a polymer having a structure of Formula 2), which may have cross-linkages on the reaction with alcohol groups in resin to derive a cross-linking reaction during the hard-baking stage following a coating stage in order to endow improved properties to an organic anti-reflective coating film produced, such as a good molding property, air-tightness and dissolution resistance, then produced a cross-linked product by a thermal-reaction created by admixing the primary and the secondary polymers. In this manner, both of the polymers having Formulas 1 and 2 form the organic anti-reflective coating film to appropriately control the interference condition of the light source having a wavelength of 193 nm.

In particular, a cross-linking agent (the polymer of Formula 2) in the form of a polymer is designed to maximize the efficiency of the cross-linking reaction. It is possible to freely adjust the k value of the organic anti-reflective coating film by controlling the proportion of the primary polymer among the anti-reflective coating film, therefore, to freely control the k value of the anti-reflective coating film according to conventionally known processes even without further synthesizing alternative polymers.

Further, the disclosed anti-reflective coating resin has adequate solubility in all hydrocarbon solvents while having dissolution resistance in all of the solvents during hard-baking step. Furthermore, no undercutting or footing is experienced upon the formation of patterns. In particular, because the anti-reflective coating resin is made from an acrylate polymer which has an etching rate higher than that of the photosensitive film during the etching process, the etching selectivity is improved.

The following examples are set forth to illustrate more clearly the principles and practice the principles of the disclosure to a person skilled in the art. As such, they are not intended to limit this disclosure, but are illustrative of certain preferred embodiments.

EXAMPLES

Example 1

Preparation (or Synthesis) of poly[methoxystyrene-(2-hydroxyethylacrylate)] copolymer A 500 ml round bottom flask was charged with 0.1 mole of methoxystyrene monomer/0.1 mole of 2-hydroxyethylacrylate while stirring and 300 g of separately prepared tetrahydrofuran was added to form a complete mixture. Thereafter, 0.1 to 3.0 g of 2,2'-azobisisobutyronitrile was added to allow polymerization reaction at a temperature ranging from about 60 to 75° C. under a nitrogen atmosphere for a time period ranging from about 5 to about 20 hours. After the completion of the reaction, the obtained solution was precipitated with ethyl ether or n-hexane solvent and then filtered and dried to obtain a poly[methoxystyrene-(2-hydroxyethylacrylate)] resin of the following Formula 7 (yield: 82%).

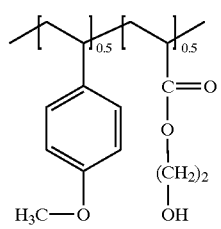

Formula 7

Example 2

Preparation of poly[methoxystyrene-(3-hydroxypropylacrylate)] copolymer

A 500 ml round bottom flask was charged with 0.1 mole of methoxystyrene monomer/0.1 mole of 3-hydroxypropylacrylate while stirring and 300 g of separately prepared tetrahydrofuran was added to form a complete mixture. Thereafter, 0.1 to 3.0 g of 2,2'-azobisisobutyronitrile was added to allow a polymerization reaction at a temperature ranging from about 60 to about 75° C. under a nitrogen atmosphere for a time period ranging from about 5 to about 20 hours. After the completion of the reaction, the obtained solution was precipitated with ethyl ether or n-hexane solvent and then filtered and dried to obtain poly[methoxystyrene-(3-hydroxypropylacrylate)] resin of the following Formula 8 (yield: 79%).

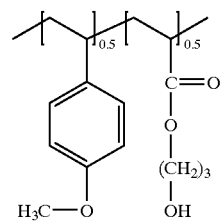

Formula 8

Example 3

Preparation of poly[methoxystyrene-(4-hydroxybutylacrylate)] copolymer

A 500 ml round bottom flask was charged with 0.1 mole of methoxystyrene monomer/0.1 mole of 4-hydroxybutylacrylate while stirring and 300 g of separately prepared tetrahydrofuran was added to form a mixture. Thereafter, 0.1 to 3.0 g of 2,2'-azobisisobutyronitrile was added to allow a polymerization reaction at a temperature ranging from about 60 to about 75° C. under a nitrogen atmosphere for a time period ranging from about 5 to about 20 hours. After completion of the reaction, the obtained solution was precipitated with ethyl ether or n-hexane solvent and then filtered and dried to obtain a poly[methoxystyrene-(4-hydroxybutylacrylate)]resin of the following Formula 9 (yield: 78%).

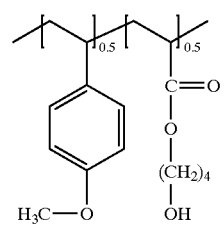

Formula 9

Example 4

Preparation of poly[methoxystyrene-(2-hydroxyethylmethacrylate)] copolymer

A 500 ml round bottom flask was charged with 0.1 mole of methoxystyrene monomer/0.1 mole of 2-hydroxyethylmethacrylate while stirring and 300 g of separately prepared tetrahydrofuran was added to form a mixture. Thereafter, 0.1 to 3.0 g of 2,2'-azobisisobutyronitrile was added to allow a polymerization reaction at temperature ranging from about 60 to about 75° C. under a nitrogen atmosphere for a time period ranging from about 5 to about 20 hours. After the completion of the reaction, the obtained solution was precipitated with an ethyl ether or n-hexane solvent and then filtered and dried to obtain a poly[methoxystyrene-(2-hydroxyethylmethacrylate)]resin of the following Formula 10 (yield: 83%).

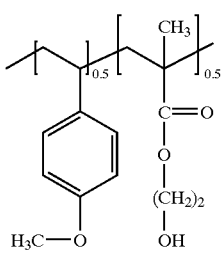

Formula 10

Example 5

Preparation of poly[methoxystyrene-(3-hydroxypropylmeth-acrylate)] copolymer

A 500 ml round bottom flask was charged with 0.1 mole of methoxystyrene monomer/0.1 mole of 3-hydroxypropylmethacrylate while stirring and 300 g of separately prepared tetrahydrofuran was added to form a mixture. Thereafter, 0.1 to 3.0 g of 2,2'-azobisisobutyronitrile was added to allow a polymerization reaction at a temperature ranging from about 60 to about 75° C. under a nitrogen atmosphere for a time period ranging from about 5 to about 20 hours. After the completion of the reaction, the obtained solution was precipitated with ethyl ether or n-hexane solvent and then filtered and dried to obtain a poly[methoxystyrene-(3-hydroxypropylmethacrylate)]resin of the following Formula 11 (yield: 81%).

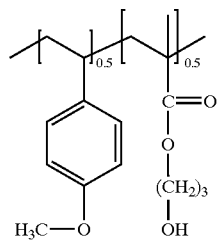

Formula 11

Example 6

Preparation of poly[methoxystyrene-(4-hydroxybutylmeth-acrylate)]copolymer

A 500 ml round bottom flask was charged with 0.1 mole of methoxystyrene monomer/0.1 mole of 4-hydroxybutylmethacrylate while stirring and 300 g of separately prepared tetrahydrofuran was added to form a mixture. Thereafter, 0.1 to 3.0 g of 2,2'-azobisisobutyronitrile was added to allow a polymerization reaction at a temperature ranging from about 60 to about 75° C. under a nitrogen atmosphere for a time period ranging from about 5 to about 20 hours. After the completion of the reaction, the obtained solution was precipitated with ethyl ether or n-hexane solvent and then filtered and dried to obtain a poly[methoxystyrene-(4-hydroxybutyl methacrylate)]resin of the following Formula 12 (yield: 78%).

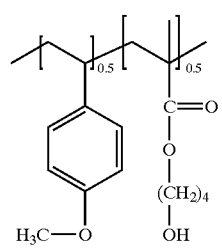

Formula 12

Example 7

Preparation of an Anti-reflective Coating Film

A polymer of Formula 1 as prepared in any one of Examples 1 to 6 and a polymer of Formula 2 were dissolved together in propyleneglycolmethylether acetate (PGMEA). The obtained solution was filtered, coated on a wafer, and hard-baked at a temperature ranging from about 100 to about 300° C. for a time period ranging from about 10 to about 1,000 seconds. Then, a photosensitive film was applied thereon and followed by a typical process for forming ultrafine patterns.

The cross-linking agent used in the form of a polymer is designed to maximize the efficiency of the cross-linking reaction. Particularly, it is possible to freely modify the k value of the organic anti-reflective coating film by controlling the proportion of the primary polymer. Consequently, the prior art problem wherein the control of the k value was not possible has been overcome.

Moreover, the anti-reflective coating resin includes two monomers having large sized chromophores that enables a polymer made therefrom to achieve a high absorbance at the wavelength of 193 nm, one of the chromophores having a weak basic property to protection from undercutting owing to unbalance of acidity after making a film.

Further, the anti-reflective coating resin exhibits superior solubility in all hydrocarbon solvents, while neither dissolve in any of the solvents during a hard-baking process nor experience undercutting and footing in the process for patterning. In particular, since the anti-reflective coating resin is composed of acrylate based polymer, it has the etching rate higher than that of a photosensitive film and, in turn, an improved etching selectivity.

It is to be understood the terminology used is intended to be in the nature of description rather than of limitation. It must be understood that many modifications and variations are possible in light of the above teachings. Therefore, it is to be understood that within the scope of the appended claims, the principles of this disclosure may be practiced otherwise than as specifically described.

What is claimed:
1. A polymer comprising a structure represented by the following Formula 1:

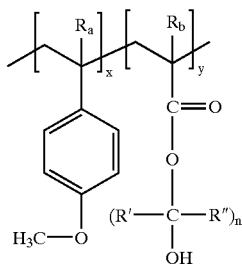

Formula I wherein:

$R_a$ and $R_b$ are independently hydrogen or methyl;

R' and R" are independently selected from the group consisting of —H, —OH, —OCOCH$_3$, —COOH, —CH$_2$OH, or an alkyl having 1 to 6 carbon atoms and alkoxy alkyl having 1 to 6 carbon atoms;

n is an integer selected from the group consisting of 1, 2, 3, 4 and 5; and x and y each is a mole fraction ranging from about 0.01 to about 0.99.

2. The polymer as set forth in claim 1, wherein $R_a$ and $R_b$ each is a hydrogen; R' and R" each is a hydrogen; n is 2; and x and y each is 0.5.

3. The polymer as set forth in claim 1, wherein $R_a$ and $R_b$ each is a hydrogen; R' and R" each is a hydrogen; n is 3; and x and y each is 0.5.

4. The polymer as set forth in claim 1, wherein $R_a$ and $R_b$ each is a hydrogen; R' and R" each is a hydrogen; n is 4; and x and y each is 0.5.

5. The polymer as set forth in claim 1, wherein $R_a$ is a hydrogen and $R_b$ is a methyl group; R' and R" each is a hydrogen; n is 2; and x and y each is 0.5.

6. The polymer as set forth in claim 1, wherein $R_a$ is a hydrogen and $R_b$ is a methyl group; R' and R" each is a hydrogen; n is 3; and x and y each is 0.5.

7. The polymer as set forth in claim 1, wherein $R_a$ is a hydrogen and $R_b$ is a methyl group; R' and R" each is a hydrogen; n is 4; and x and y each is 0.5.

8. A method for preparing a polymer of claim 1, which comprises the steps of dissolving methoxystyrene monomer and hydroxyalkylacrylate monomer in a solvent and polymerizing the monomers in the presence of a polymerization initiator in the solvent.

9. The method as set forth in claim 8, wherein the solvent is selected from the group consisting of tetrahydrofuran, toluene, benzene, methylethylketone, dioxane and mixtures thereof.

10. The method set forth in claim 8, wherein the polymerization initiator is selected from the group consisting of 2,2'-azobisisobutyronitrile, acetylperoxide, lauryl peroxide, t-butylperoxide, and mixtures thereof.

11. The method set forth in claim 8, wherein the polymerization is carried out at a temperature ranging from about 50 to about 90° C.

12. An anti-reflective coating composition comprising a polymer of claim 1 and a polymer of the following Formula 2:

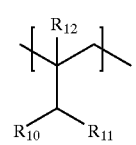

Formula 2 wherein, $R_{10}$ and $R_{11}$ are independently a $C_{1-10}$ alkoxy and $R_{12}$ is hydrogen or a methyl group.

13. A method for forming an anti-reflective coating, in which an anti-reflective coating composition of claim 12 is dissolved in an organic solvent and is coated on a wafer and the wafer is subjected to a hard baking.

14. The method set for the in claim 13, wherein the organic solvent is selected from the group consisting of ethyl-3-ethoxypropionate, methyl 3-methoxypropionate, cyclohexanone, and propyleneglycolmethylether acetate.

15. The method set forth in claim 13, wherein the organic solvent is used in an amount ranging from about 200 to about 5,000 wt. % based on the total weight of the anti-reflective coating composition.

16. The method set forth in claim 13, wherein the hard-baking is carried out at a temperature ranging from about 100 to about 300° C.

17. A semiconductor device, fabricated by using an anti-reflective coating composition of claim 12.

* * * * *